(12) United States Patent
Winograd et al.

(10) Patent No.: US 6,633,952 B2
(45) Date of Patent: Oct. 14, 2003

(54) PROGRAMMABLE REFRESH SCHEDULER FOR EMBEDDED DRAMS

(75) Inventors: Gil I. Winograd, Irvine, CA (US); Sami Issa, Irvine, CA (US); Morteza Cyrus Afghahi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 100 days.

(21) Appl. No.: 09/929,268

(22) Filed: Aug. 14, 2001

(65) Prior Publication Data

US 2002/0040417 A1 Apr. 4, 2002

Related U.S. Application Data

(60) Provisional application No. 60/237,941, filed on Oct. 3, 2000, and provisional application No. 60/237,967, filed on Oct. 3, 2000.

(51) Int. Cl.[7] .............................................. G06F 12/00
(52) U.S. Cl. ................... 711/106; 365/222; 365/230.03; 365/230.06; 365/230.08; 365/189.04
(58) Field of Search .......................... 711/106; 365/222, 365/230.03, 230.06, 230.08, 189.04

(56) References Cited

U.S. PATENT DOCUMENTS

| | | | | |
|---|---|---|---|---|
| 5,742,554 A | | 4/1998 | Fujioka | |
| 5,959,923 A | * | 9/1999 | Matteson et al. | 365/222 |
| 5,970,507 A | | 10/1999 | Kato et al. | |
| 6,307,776 B1 | * | 10/2001 | So et al. | 365/185.03 |
| 6,415,353 B1 | * | 7/2002 | Leung | 711/106 |

* cited by examiner

*Primary Examiner*—Donald Sparks
*Assistant Examiner*—Mehdi Namazi
(74) *Attorney, Agent, or Firm*—Christie, Parker & Hale, LLP

(57) ABSTRACT

In one aspect, the invention describes a mechanism for refreshing multiple memory words (rows) per refresh cycle, the number of simultaneously refreshed rows being programmable by a small number of inputs. In another aspect, the invention discloses a mechanism for refreshing all banks or a programmable number of banks simultaneously in a multi-bank memory. In yet another aspect, the present invention describes a mechanism for refreshing a programmable multiple memory rows and a programmable multiple banks simultaneously.

25 Claims, 12 Drawing Sheets

PROGRAMMABLE REFRESH SCHEDULER FOR EMBEDDED DRAMS

CROSS-REFERENCE TO RELATED APPLICATIONS

This patent application claims the benefit of the filing date of U.S. Provisional Patent Applications Ser. Nos. 60/237,941, filed Oct. 3, 2000 and entitled "PROGRAMMABLE BANK REFRESH CONTROLLER FOR EMBEDDED DRAM"; and 60/237,967, filed Oct. 3, 2000 and entitled "EMBEDDED SHIFTER FOR DRAM REFRESH SCHEDULING"; the entire contents of which are hereby expressly incorporated by reference.

FIELD OF THE INVENTION

The present invention relates to dynamic random access memories (DRAMs). More specifically, the invention relates to a programmable refresh scheduler for embedded DRAMs.

BACKGROUND OF THE INVENTION

RAM devices have become widely accepted in the semiconductor industry. Furthermore, system-on-chip (SOC) devices typically include internal RAM for storage of information such as instructions and/or data. Internal memory blocks in an SOC device typically occupy substantial chip area of an integrated circuit (IC) chip that contains the SOC device. For example, internal memory blocks may occupy as much as about 70% of the IC chip area of an SOC device. The configuration of internal memory in SOC devices are generally similar to the configuration of memory in individual memory chips.

Each block of RAM includes a number of memory cells. Each memory cell typically stores one bit of information. Typical RAM blocks have capacity to store anywhere from thousands to millions of bits of data. Since vast numbers of memory cells are used to store information in RAM blocks, the size of RAM blocks depends, to large extent, on the size of each memory cell.

Memory cells in dynamic random access memory (DRAM) blocks typically require less number of transistors per bit than cells in a static random access memory (SRAM). DRAMs typically cost less to produce than other types of memory devices due to their relative simplicity. For example, some DRAM blocks contain memory cells with three transistor (3-T) per bit, while other DRAM blocks contain memory cells with one transistor (1-T) per bit. Therefore, DRAM blocks of SOC devices and DRAM chips are typically smaller than SRAM blocks with similar information storage capacity.

However, DRAM cells need to be refreshed periodically for retaining the stored charge. A typical refresh operation comprises of selecting a memory cell, reading the stored value, and writing the same stored value back to the respective cell. Since typically the memory is accessed one word at-a-time, the refresh operation may be performed at a higher rate of one word at-a-time rather than one cell at-a-time, however, the time interval between refreshing word may still be large. This large time interval between refreshing particular words may not be sufficient for memory cells in a large memory module to retain their charges.

The maximum time interval between required refreshes is directly proportional to the capacitance of the DRAM cell and exponentially related to the (additive) inverse of the absolute operating temperature. Traditional DRAM memories are fabricated with a capacitance of 15–30 femto-Farad per bit. This capacitance is achieved by chip fabrication steps which are not usually a part of logic CMOS processing. DRAM memories which are integrated on-chip and fabricated with a standard CMOS process flow have a lower capacitance, in the range of 3–10femto-Farad per bit for 0.18 um technology. These cells require shorter refresh intervals. For a large memory, it may be necessary to refresh more than one memory word simultaneously to meet the refresh interval requirement, particularly at temperatures above 100 C.

Furthermore, traditional mechanisms for selecting a word of a hierarchical memory for refresh involves supplying an address that is decoded and results in the unique activation of a memory bank and one global word line. This mechanism utilizes almost the entire memory infrastructure to accomplish an action that is local to a particular memory block.

Therefore, there is a need for a flexible system and method capable of refreshing many words simultaneously.

SUMMARY OF THE INVENTION

Present invention describes a new design that allows for efficient refreshing of DRAMs. In one aspect, the invention describes a mechanism for refreshing multiple memory words (rows) per refresh cycle, the number of simultaneously refreshed rows being programmable by a small number of inputs. In another aspect, the invention discloses a mechanism for refreshing all banks or a programmable number of banks simultaneously in a multi-bank memory. In yet another aspect, the present invention describes a mechanism for refreshing a programmable multiple banks and a programmable multiple memory rows in each bank simultaneously.

In one aspect, the present invention describes a DRAM programmable for simultaneous refreshing of a plurality of memory words comprising: a plurality of memory banks each memory bank including a plurality of memory blocks and each memory block including a plurality of memory words; a plurality of bank decoders for selecting a respective memory bank; a plurality of word decoders for selecting a respective memory word in a memory block; a plurality of local sense amplifiers for amplifying data for a plurality of local bit lines respectively; and a programmable register for selecting a plurality of memory words for simultaneous refreshing.

The programmable register may be programed to simultaneously refresh a plurality of memory words in a selected plurality of memory banks, or to simultaneously refresh a plurality of memory words in a selected memory bank. Furthermore, a second register may be programed to simultaneously refresh a plurality of memory words in each selected memory bank, while the first register is programed to simultaneously refresh a plurality of memory words in a selected plurality of memory banks.

In another aspect, the present invention discloses a method for simultaneously refreshing a plurality of DRAM words, the method comprising the steps of: arranging the DRAM with a plurality of memory banks, each memory bank including a plurality of memory blocks, wherein each memory bank is selectable by a bank decoder; arranging each memory block with a plurality of memory words, wherein each memory word is selectable by a word decoder; and programming a register for selecting a plurality of memory words to be refreshed simultaneously.

BRIEF DESCRIPTION OF THE DRAWINGS

The objects, advantages and features of this invention will become more apparent from a consideration of the following detailed description and the drawings, in which.

DETAILED DESCRIPTION

Figure 1:
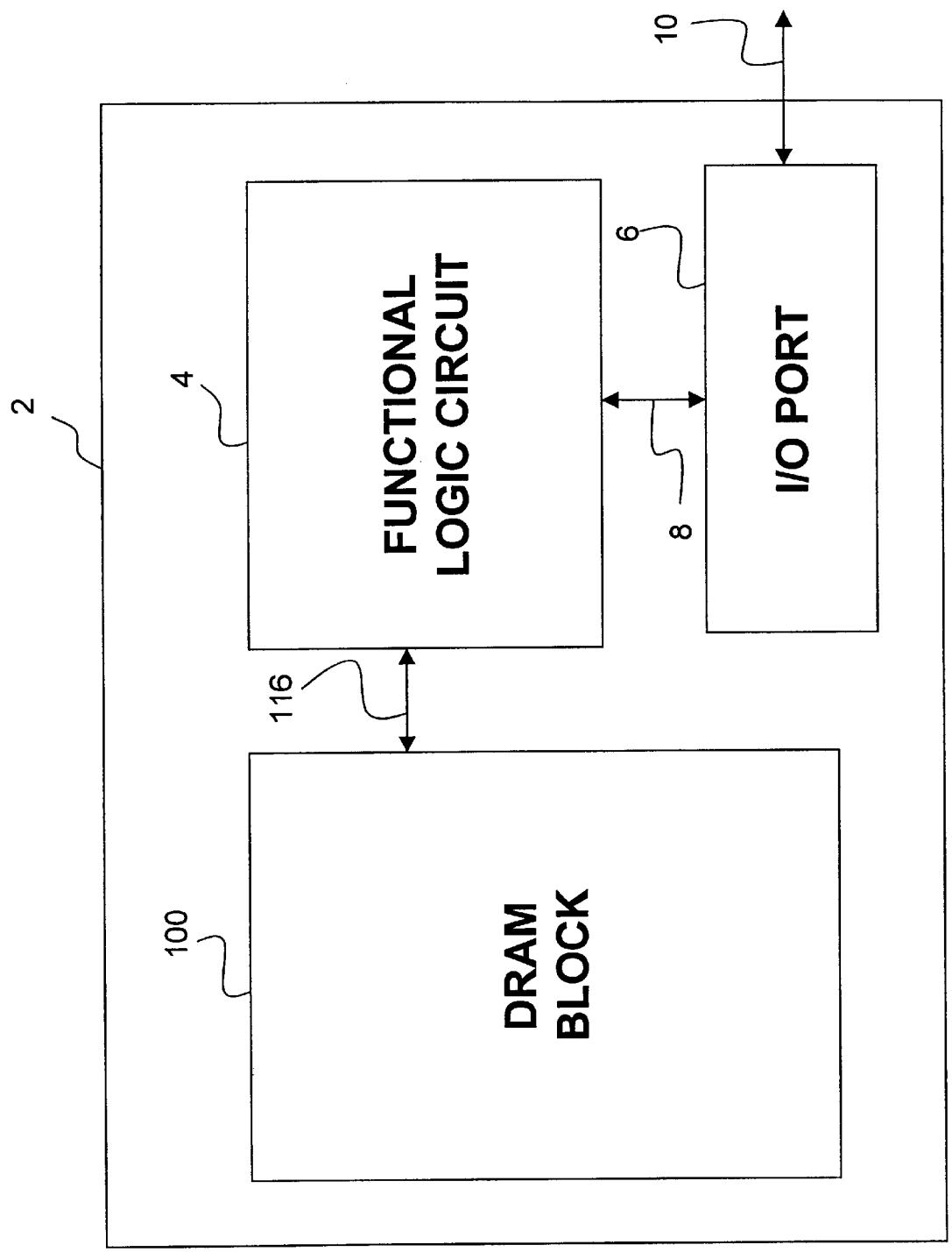
FIG. 1 is an exemplary block diagram of a system-on-chip (SOC) device that includes a dynamic random access memory (DRAM) block, according to one embodiment of the present invention.

FIG. 1 is a block diagram of a system-on-chip (SOC) device 2. The SOC device 2 preferably includes a functional logic circuit 4 for data processing. The functional logic circuit 4 preferably communicates with external devices using an I/O port 6 over an I/O interface 8. The I/O port 6 transmits and receives data to and from the external devices over an external interface 10. The SOC device 2 also includes a DRAM block 100. The DRAM block 100 may be used to store data and information for data processing by the functional logic circuit 4. The functional logic circuit preferably accesses the data and/or information used during data processing over a data bus 116. For example, the SOC device 2 may be a high speed switch chip. In the high speed switch chip, the DRAM block 100 may typically store information regarding source and destination of data packets. In the high speed switch chip, the I/O port 6 may be a transceiver for receiving and transmitting the data packets. The functional logic circuit 4 in the high speed switch chip may be used to switch or route the incoming data packets to external devices based on the information stored in the DRAM block 100.

Figure 2:
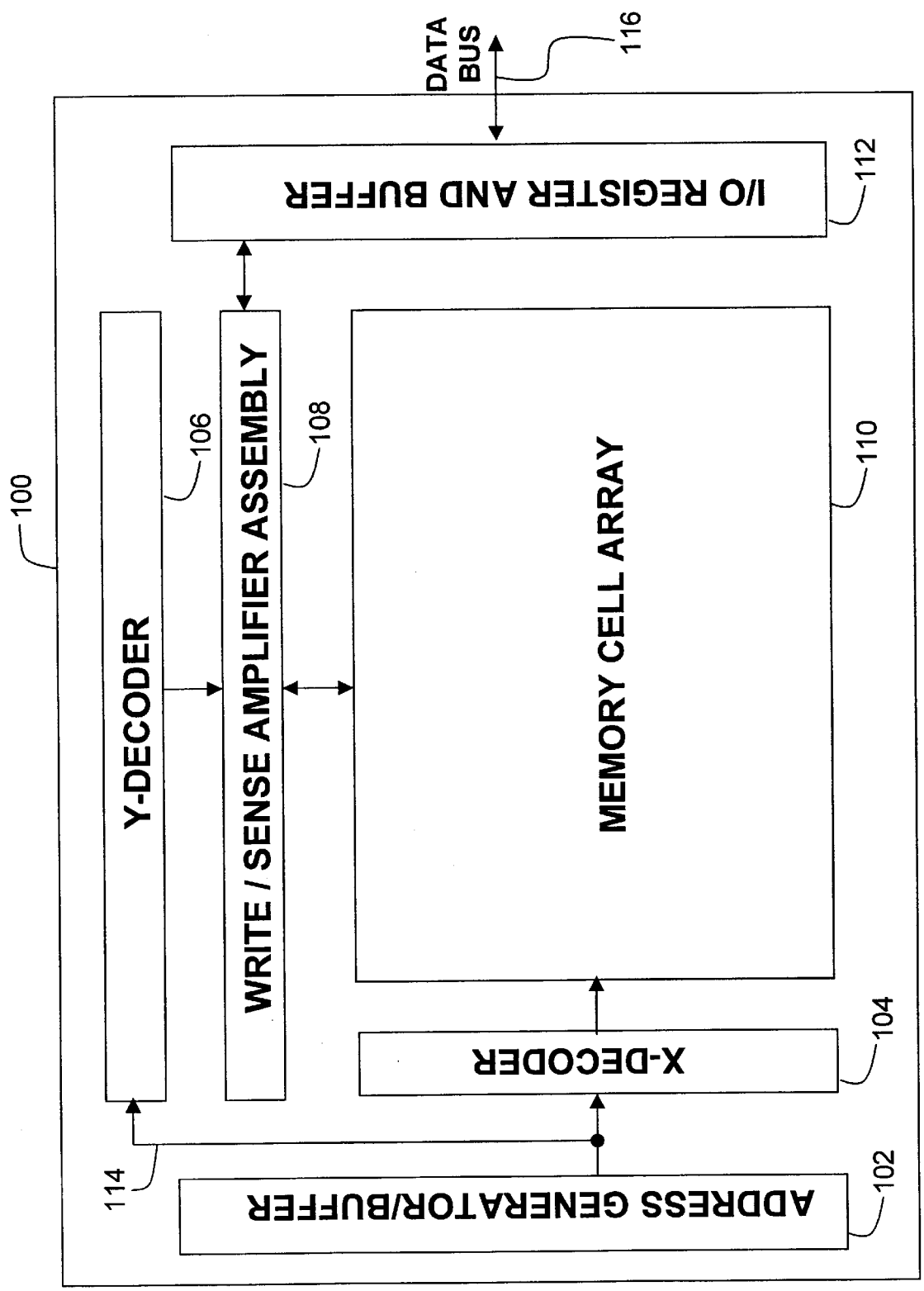
FIG. 2 is an exemplary block diagram of a RAM block of an SOC device or a RAM chip, according to one embodiment of the present invention.

FIG. 2 is an exemplary block diagram of the DRAM block 100. The DRAM block 100 may be used as a part of an SOC device as in FIG. 1, or as a part of an individual DRAM chip.

The DRAM block 100 preferably includes a memory cell array 110. The memory cell array 110 includes a number of memory cells. The memory cells in the memory cell array 110 are organized into rows and columns. The DRAM 100 also includes a sense amplifier assembly 108. The sense amplifier assembly 108 includes multiple sense amplifiers that may be shared by several memory cells.

The number of rows and columns of memory cells in the memory cell array 110 determines the information storage capacity of the DRAM block. The number of bits that the DRAM block 100 stores may range from hundreds to hundreds of millions or more. The DRAM block 100 also includes a Y decoder 106. The Y decoder 106 receives address signals and selects the columns of memory cells in the memory cell array for reading, writing and refreshing operations. In other words, the Y decoder 106 decodes the address signals to generate column select signals to select columns in the memory cell array 110 for writing and reading, respectively.

The DRAM block 100 also includes an X decoder 104. The X decoder 104 is used to select rows of the memory cell array 110 for reading, writing and refreshing. The X decoder 104 receives address signals and decodes them to select one or more rows of the memory cell array. The DRAM block 100 also includes an address generator/buffer 102. The address generator/buffer 102 either generates addresses within the DRAM block or the addresses may be provided by a component or a device outside of the DRAM block. The address generator/buffer 102 provides the addresses 114 to the Y decoder 106 and the X decoder 104. The addresses 114 include an access address and a refresh address. The access address is used for normal memory cell access operations such as read and write. The refresh address is used for refreshing the memory cells.

In one embodiment, the DRAM block 100 also includes an I/O register and buffer 112. The I/O register and buffer 112 is used to temporarily store data bits to be written to the memory cells during writing operations. The I/O register and buffer 112 is also used to temporarily store data bits that are read from the memory cells. The I/O register and buffer 112 interfaces the memory cell array 110 to a memory data bus 116 through the sense amplifier assembly 108.

Figure 3:
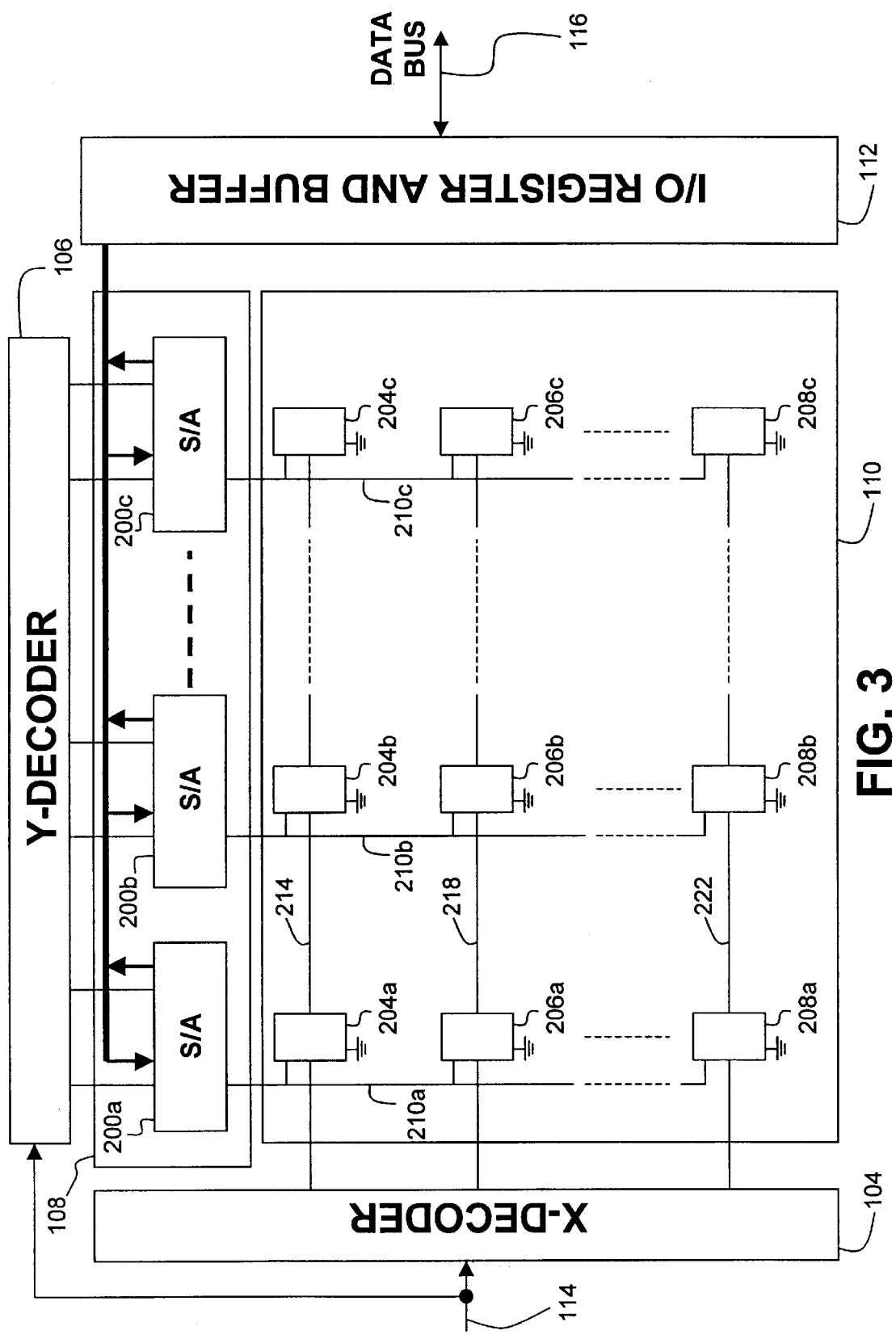
FIG. 3 is an exemplary block diagram that illustrates details of a sense amplifier assembly and a memory cell array, according to one embodiment of the present invention.

FIG. 3 is a block diagram that shows details of the memory cell array 110 and the sense amplifier assembly 108 in one embodiment of the present invention. Components of the memory cell array and the sense amplifier assembly, such as write amplifiers, sense amplifiers, memory cells, read bit lines, write bit lines, select lines, are shown in FIG. 3 for illustrative purposes only. The DRAM block of the present invention may include many more columns of memory cells and corresponding sense amplifiers. In addition, the DRAM block may include many more rows of memory cells.

In the one embodiment of the present invention, each of the memory cells in the memory cell array 110 is a 1-T cell that is associated with one write/read bit lines. Each of the write/read bit lines is used to write to the associated memory cells and read from the associated memory cells. The write/read bit lines are coupled to the sense amplifiers.

Memory cells 204a, 206a and 208a represent a first column of memory cells in the memory cell array 110. Memory cells 204b, 206b and 208b represent a second column of memory cells in the memory cell array 110. Memory cells 204c, 206c and 208c represent an mth column of memory cells in the memory cell array 110. Write/read bit line 210a is coupled to the first column of memory cells and couples the sense amplifier 200*a* to each of the memory cells 204*a*, 206*a* and 208*a*.

The X decoder 104 receives and decodes the addresses 114, and provides row select signal through select line 214, to a first row of memory cells 204*a*, 204*b* and 204*c*. The X decoder 104 also provides cell select signals through select line 218, to a second row of memory cells 206*a*, 206*b* and 206*c*. In addition, the X decoder 104 provides cell select signal through select lines 222 and 224 to an nth row of memory cells 208*a*, 208*b* and 208*c*. The Y decoder 106 receives and decodes the addresses 114, and provides column (word) select signals to the sense amplifiers for writing to and reading from the respective memory cells.

Figure 4A:
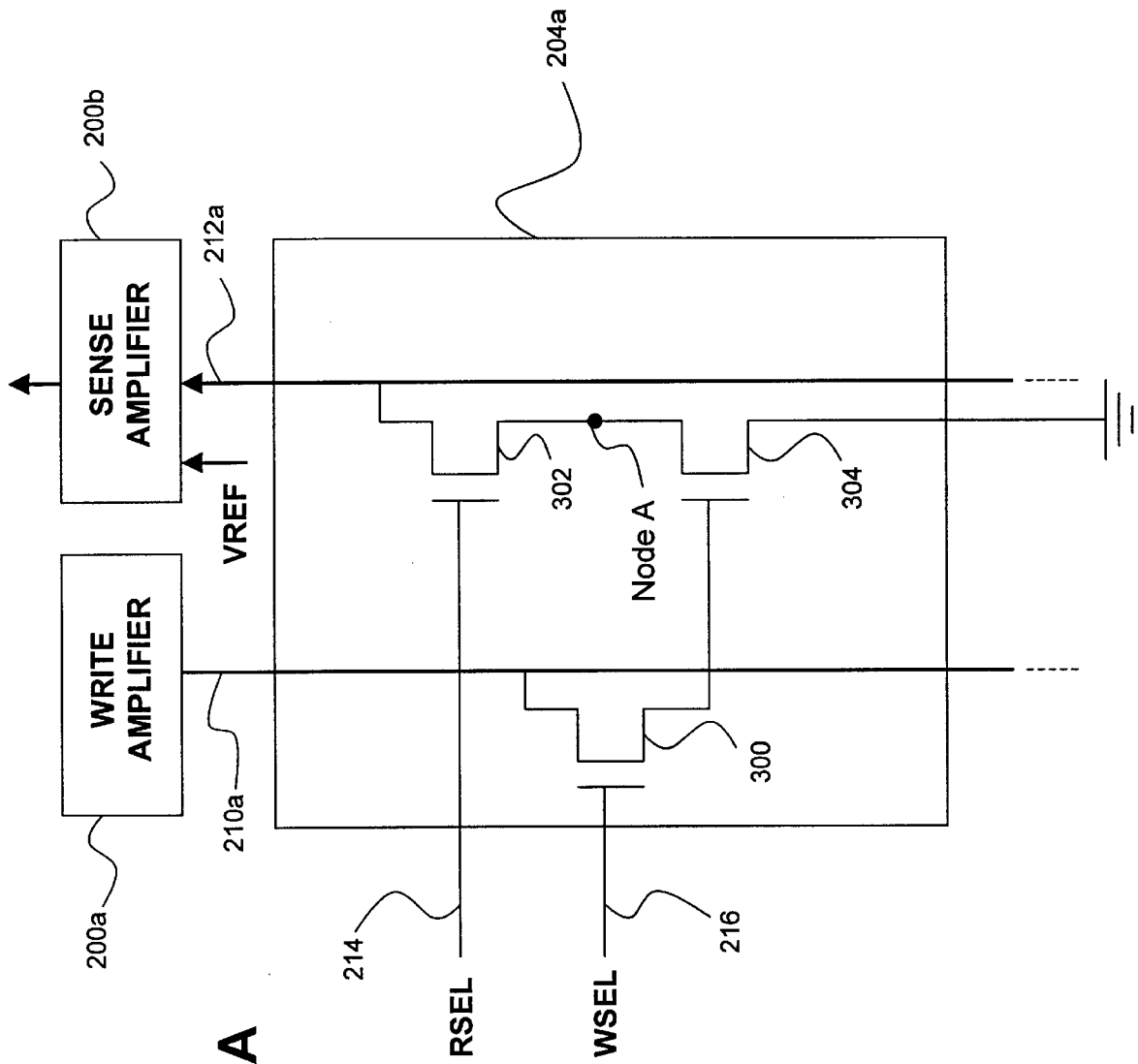
FIG. 4A is an exemplary detailed block diagram of a 3-T memory cell, according to one embodiment of the present invention.

FIG. 4A is an exemplary block diagram of a 3-T memory cell 204*a*. In one embodiment of the present invention, the transistors are NMOS transistors. The memory cell 204*a* is coupled to a write amplifier 200*a* and a sense amplifier 200*b* through a write bit line 210*a* and a read bit line 212*a*, respectively. The memory cell 204*a* is also coupled to a read select line 214 and a write select line 216.

The write select line 216 is coupled at a gate of a transistor 300. A drain of the transistor 300 is coupled to a write amplifier 200*a* over the write bit line 210*a*. A source of the transistor 300 is coupled to a gate of a transistor 304. A source of the transistor 304 is coupled to ground. A drain of the transistor 304 is coupled to a source of a transistor 302 at node A. The read select line 214 is coupled to a gate of the transistor 302. A drain of the transistor 302 is coupled to the sense amplifier 200*b* over the read bit line 212*a*.

When the memory cell 204*a* is selected for writing, a logic high write select signal is provided at the gate of the transistor 300 over the write select line 216. Meanwhile, the write amplifier 200*a* provides the write bit line 210*a* with a data bit to be written to the memory cell 204*a*. With the logic high write select signal, the transistor 300 turns on, thus allowing the data bit to pass through the transistor 300 and be provided to the gate of the transistor 304.

If the provided data bit is a logic low data bit, the transistor 304 does not turn on, and the ground is not propagated to node A. On the other hand, if the data bit is a logic high data bit, the transistor 304 turns on. At this time, the gate of the transistor 304 is positively charged, and the transistor 304 stays on. In this case, since the source of the transistor 304 is coupled to ground, the voltage level at node A approaches ground. In other words, node A is pulled down to logic low.

Since the write select signal and the read select signal are mutually exclusive, when the write select signal is logic high, the read select signal is logic low. Therefore, a logic low read select signal is provided at the gate of the transistor 302 over the read select line 214. Since the transistor 302 is an n-type transistor, it does not turn on, i.e., it turns off, when the logic low read select signal is applied at the gate.

For reading, prior to selecting the memory cell 204*a* with the read select signal, the sense amplifier 200*b* pre-charges the read bit line 212*a* by coupling it to a high voltage, e.g., Vdd. Once the read bit line 212*a* is pre-charged to logic high, the high voltage is uncoupled from the bit line 212*a*. Thus, the read bit line 212*a* is floating at logic high.

When a logic high read select signal is provided at the gate of the transistor 302, the transistor 302 turns on, allowing the voltage at node A onto the read bit line 212*a* to be read by the sense amplifier 200*b*. At the same time, since the read select signal and the write select signal are mutually exclusive, the write select signal is logic low, and the transistor 300 is not turned on.

If the transistor 304 has been turned on through a write operation with a logic high data bit, the ground is propagated to node A and the pre-charged bit line 212*a* is pulled down to logic low during a subsequent read operation. Thus, the sense amplifier 200*b* reads logic low during the read operation. On the other hand, however, if the transistor 304 has not been turned on, ground is not propagated to node A, and the pre-charged bit line 212*a* remains at logic high. Thus, the sense amplifier 200*b* reads a logic high responsive to the written logic high data during the read operation.

Figure 4B:
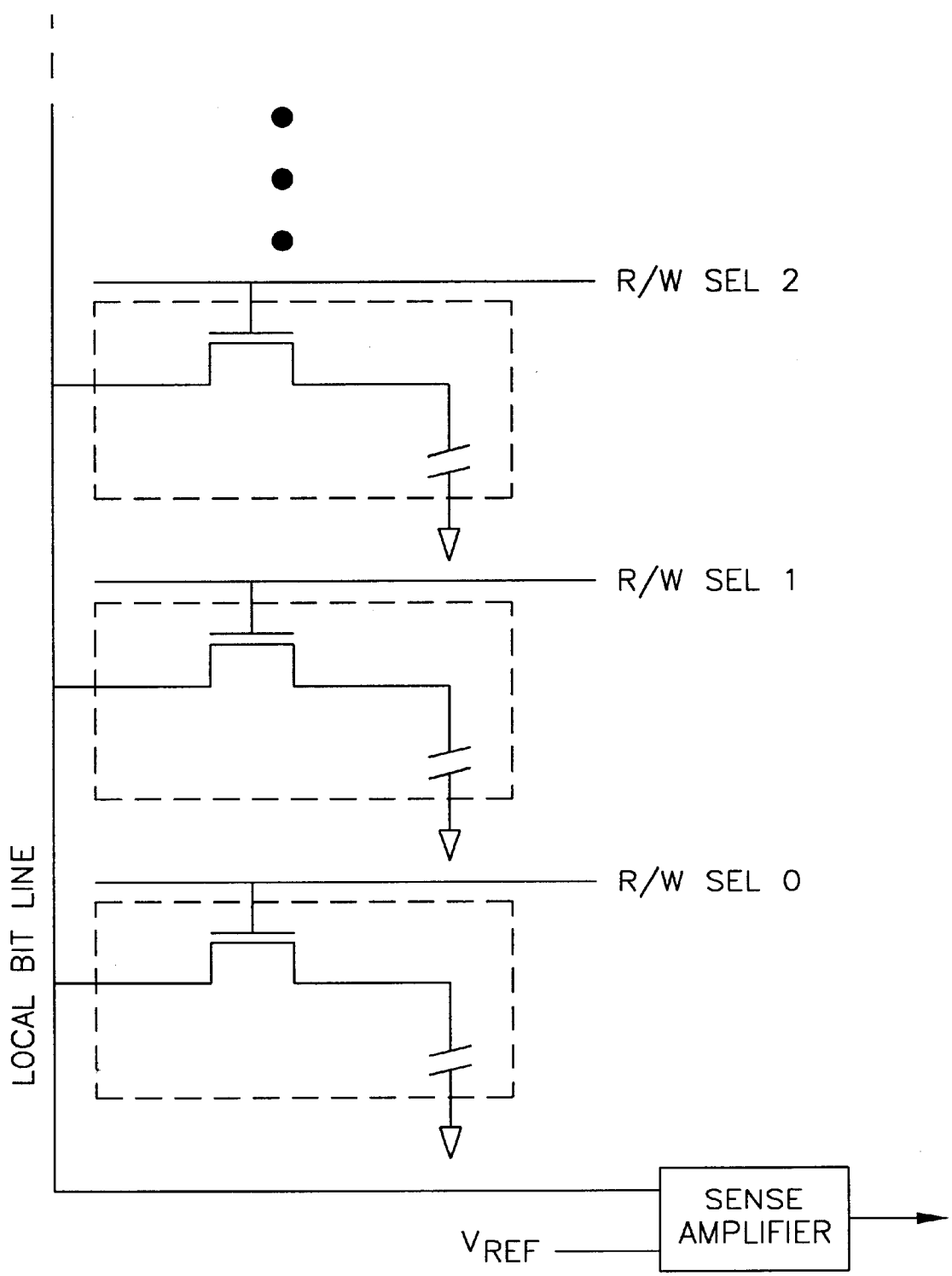
FIG. 4B is an exemplary detailed block diagram of a 1-T memory cell, according to one embodiment of the present invention.

Three exemplary 1-T memory cells are shown in FIG. 4B. Each capacitor holds a charge corresponding to a written data, respectively. Each bit line carries data into and out of the respective cell. Each transistor switch is enabled by the respective word select line which is a function of the row address. The transistor switch is situated such that its source is connected to the capacitor, its drain is connected to the bit line, and its gate is connected to the word select line. As shown in FIG. 4B, the 1-T cell design has only one line for both write and read signals.

In a typical operation, the sense amplifier is a differential amplifier with one input connected to the bit line and the other input connected to a reference voltage Vref, as shown in FIG. 4B. If the voltage on the bit line is larger than the Vref, the differential sense amplifier outputs a logic high. Likewise, if the voltage on the bit line is smaller than the Vref, the differential sense amplifier outputs a logic low.

Figure 5:
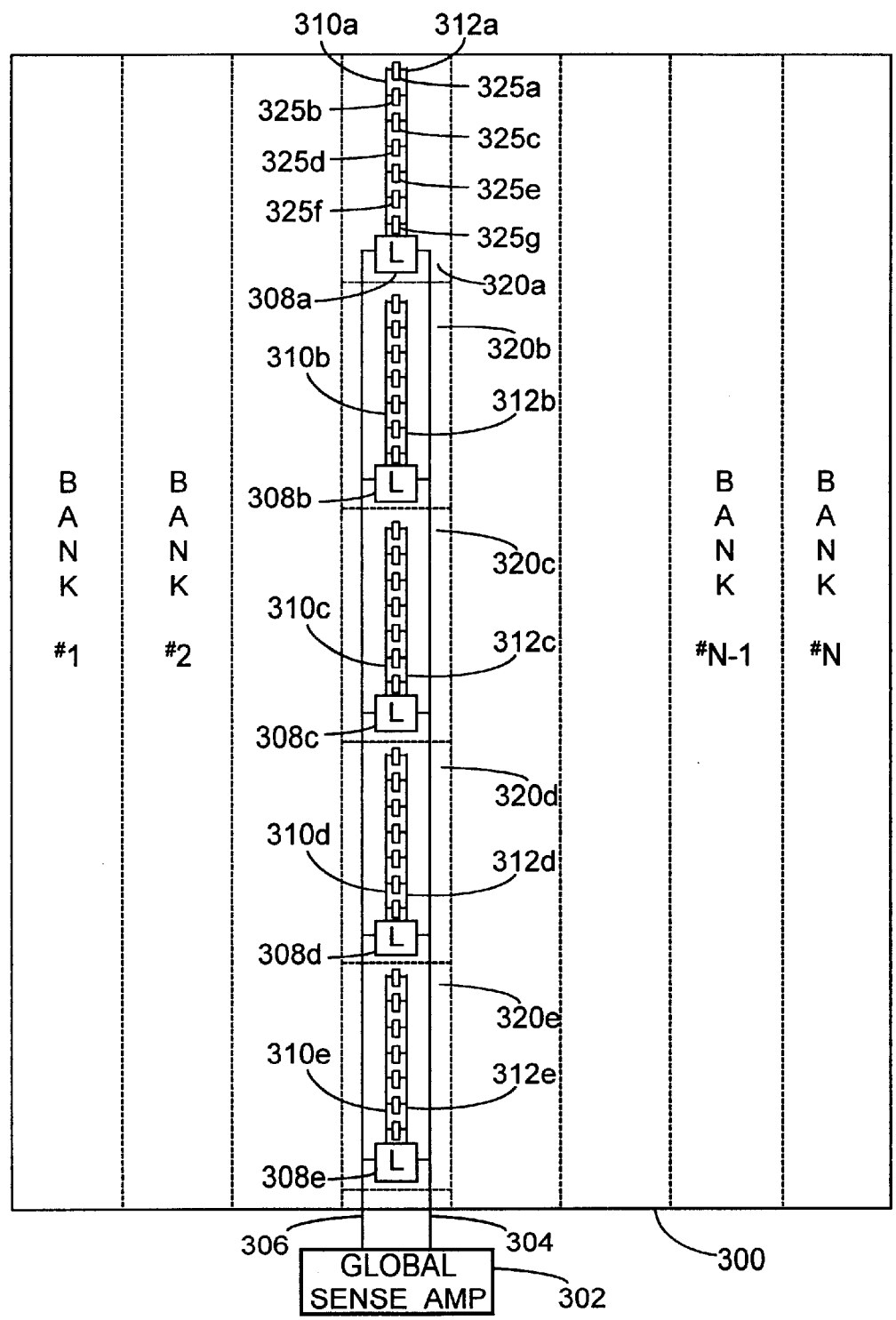
FIG. 5 is an exemplary block diagram of a hierarchical memory module using local bit line sensing, according to one embodiment of the present invention.

FIG. 5 illustrates a memory structure 300 formed by coupling multiple cooperating constituent blocks 320*a–e*, with each of the blocks 320*a–e* having a respective local sense amplifier 308*a–e*. Each block is composed of a pre-defined number of memory cells 325*a–g*, which are coupled with one of the respective local sense amplifiers 308*a–e*. Each local sense amplifiers 308*a–e* is coupled with global sense amplifier 302 via bit lines 304, 306. Because each of local sense amplifiers 308*a–e* sense only the local bit lines 310*a–e*, 312*a–e*, of the respective memory blocks 320*a–e*, the amount of time and power necessary to precharge local bit lines 310*a–e* and 312*a–e* are substantially reduced. Only when local sense amplifier 308*a–e* senses a signal on respective local lines 310*a–e* and 312*a–e*, does it provide a signal to global sense amplifier 302. This architecture adds flexibility and scalability to a memory architecture design because the memory size can be increased by adding locally-sensed memory blocks such as 320*a–e*. Each of the respective memory columns or memory banks 1-N include the respective memory blocks 320*a–e* and all words within the same block share a common set of local bit lines.

In a normal access cycle, for example in a read operation, only one row from a bank is selected, data is placed onto the local bit line, a respective local sense amplifier amplifies that data and puts the data on a global bit line which is shared by all the blocks in a memory bank. The global bit line then may input the data into a global sense amplifier which, in turn, outputs the data from the memory.

Figure 6:
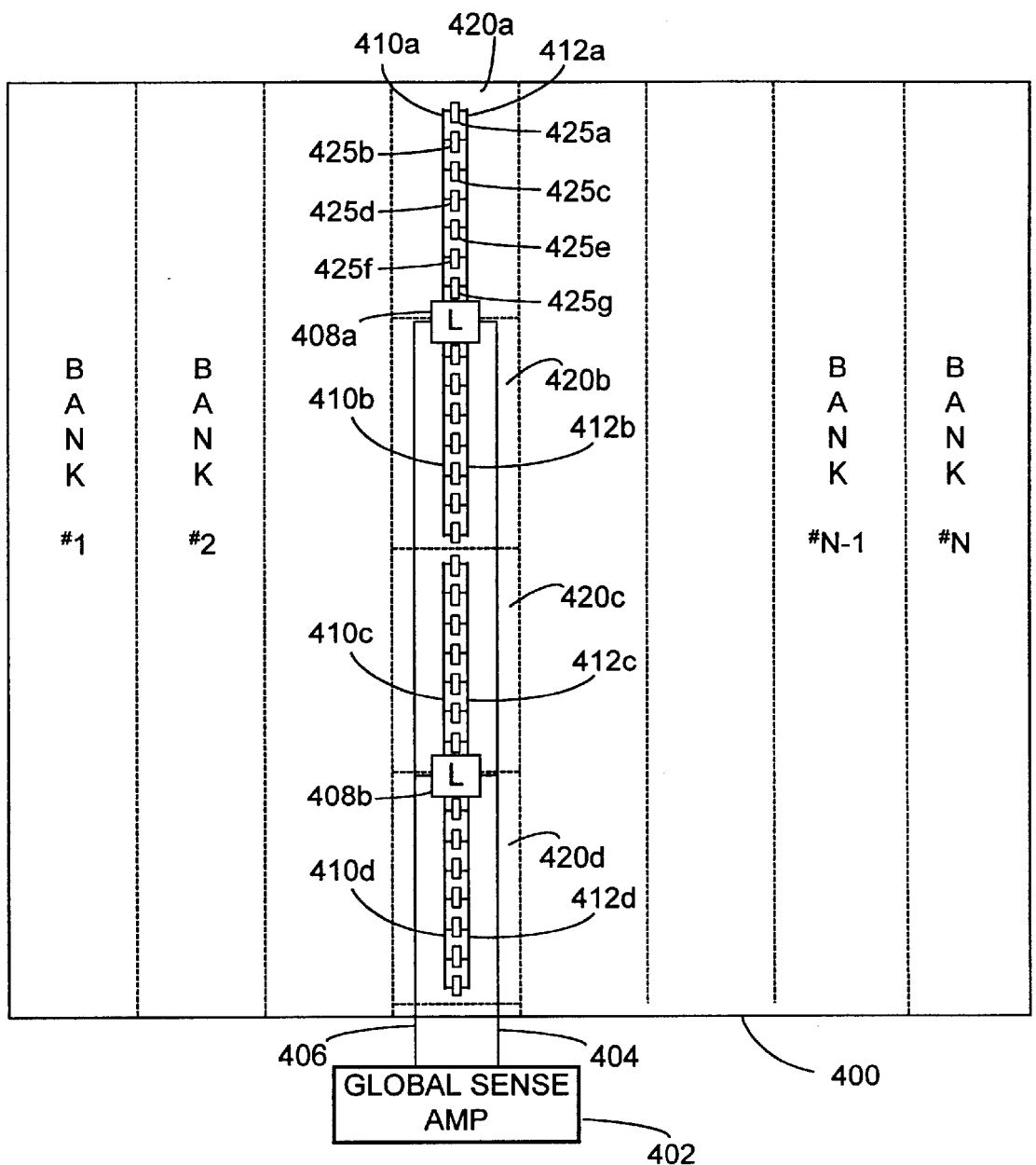
FIG. 6 is an exemplary block diagram of a hierarchical memory module using an alternative local bit line sensing, according to one embodiment of the present invention.

FIG. 6 shows a memory structure 400, which is similar to structure 300 in FIG. 5, by providing local bit line sensing of blocks 420*a–d*. Each memory block 420*a–d* is composed of a predefined number of memory cells 425*a–g*. Memory cells 425*a–g* are coupled with respective local sense amplifier 408*a, b* via local bit lines 410*a–d*, 412*a–d*. Unlike structure 300 in FIG. 5, where each block 320*a–e* has its own local sense amplifier 308*a–e*, memory blocks 420*a–d* are paired with a single sense amplifier 408*a, b*. Similar to FIG. 5, FIG. 6 shows global sense amplifier 402 being coupled with local sense amplifiers 408*a*, 408*b*.

Figure 7:
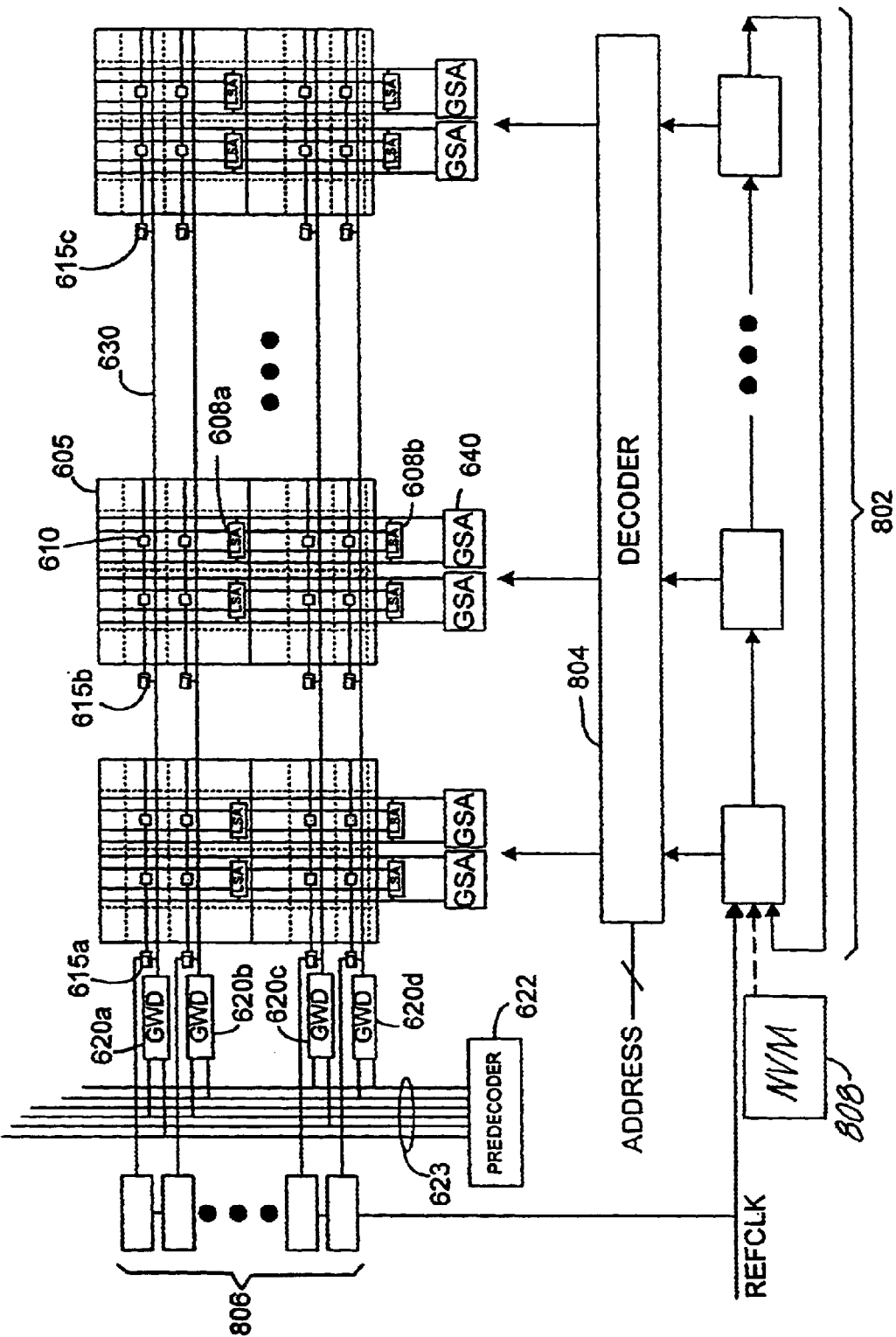
FIG. 7 is an exemplary block diagram of a hierarchical memory module using a bank register and a row register for simultaneous refresh of more than one bank and more than one row in a bank, according to one embodiment of the present invention.

FIG. 7 illustrates a hierarchical structure 600 having hierarchical word line decoding in which each hierarchical memory block 605 is composed of a predefined number of memory cells 610, which are coupled with a particular local word line decoder 615a–c. Each row of local word line decoders 615a–c is coupled with a respective global word line decoder 620. Each global word line decoder 620a–d is activated when predecoder 622 transmits address information relevant to a particular global word line decoder 620a–d via predecoder lines 623. In response, global word line decoder 620a–d activates global word line 630 which in turn, activates a particular local word line decoder 615a–c. Local word line decoder 615a–c then enables associated memory block 605, so that the particular memory cell 610 of interest can be evaluated.

Each of memory blocks 605 can be considered to be an independent memory component to the extent that the hierarchical functionality of each of blocks 605 relies upon local sensing via local sense amplifiers 608a–b, local decoding via local word line decoders 615a–c, or both. The memory blocks 605 may be memory blocks within a memory bank (column). Multiple memory devices 600 can be arrayed coupled with global bit lines or global decoding word lines, to create a composite memory component of a desired size and configuration. In this exemplary configuration, a memory address is divided into most significant bits (MSBs) and least significant bits (LSBs). The LSBs globally select a particular row of the memory, which is divided into a small number of words, each word belonging to a different bank, and the MSBs select the bank. The combination of MSBs and LSBs uniquely selects a single word.

Although FIG. 7 shows hierarchical word line decoding used in conjunction with hierarchical bit line operations, hierarchical word line decoding can be implemented without hierarchical bit line sensing. However, using both the hierarchical word line decoding, and the hierarchical bit line sensing obtains the synergistic effects of decreased power and increased speed for the entire device.

In one embodiment, the hierarchical memory structures of FIGS. 5–7 are organized into blocks, each block including a linear array of words placed in rows. Several blocks are stacked on top of each other to form banks of memory, and banks are arrayed side-by-side to form a complete memory. All words within the same block share a common set of local bit lines. For example, bit 0 of every word share the same bit line, and bit 1 of every word share the same bit line, etc.

FIG. 7 also includes a register structure 802 and a register structure 806. The bank decoding structure 804 is capable of taking the address lines, a REF signal and the respective outputs of the register 802 for selecting one or more banks to be refreshed simultaneously. The multi-word refresh mechanism described by one aspect of the present invention selects a programmable number of banks to be refreshed simultaneously in each refresh cycle using the respective outputs of register 802.

Selection of the word(s) (rows) to be refreshed within each selected bank may be accomplished by providing LSB address bits for the row, or by other means described below. For each selected row, a refresh occurs simultaneously on each selected bank. The bank selection is accomplished with the register 802 where the number of cells in the register is equal to the total number of banks in the memory. The refreshing order is flexible. For example, all the rows within one or more banks can be refreshed first, before other banks are selected for refresh, or a row may be selected for refresh and one or more banks that include the selected row may be refreshed and then, other banks that include the selected row are refreshed. Because the refresh cycle is independent of the access cycle, refreshing may be carried out with no collision. During an access cycle, the control signal REF is inactive resulting in a bypass of the outputs of the register in each respective decoder. In other words, during an access cycle, the decoders 804 and 620a–620d basically decode the address lines and ignore the outputs of the registers 802 and 806. During a refresh cycle, the REF signal becomes active and the decoders take into account the states of each respective output of the register to select one or more banks for refreshing.

The outputs of the shift register take the place of the pre-decoded MSB address bits. For example, the shift register stores a "1" in each cell which is to be refreshed in the current cycle and a "0" otherwise. At the conclusion of each cycle, a shift signal is applied to the shift register so that a different series of banks are refreshed on the next cycle. Alternatively, a new predetermined value may be loaded to the register for a new combination of banks to be refreshed next. When each bank has been refreshed a single time, a new row (or plurality of rows, as described below) in one or more banks is selected for refresh. Thus, if there is a need for a shorter refresh interval, more number of "1s" are loaded into the register.

Figure 8:
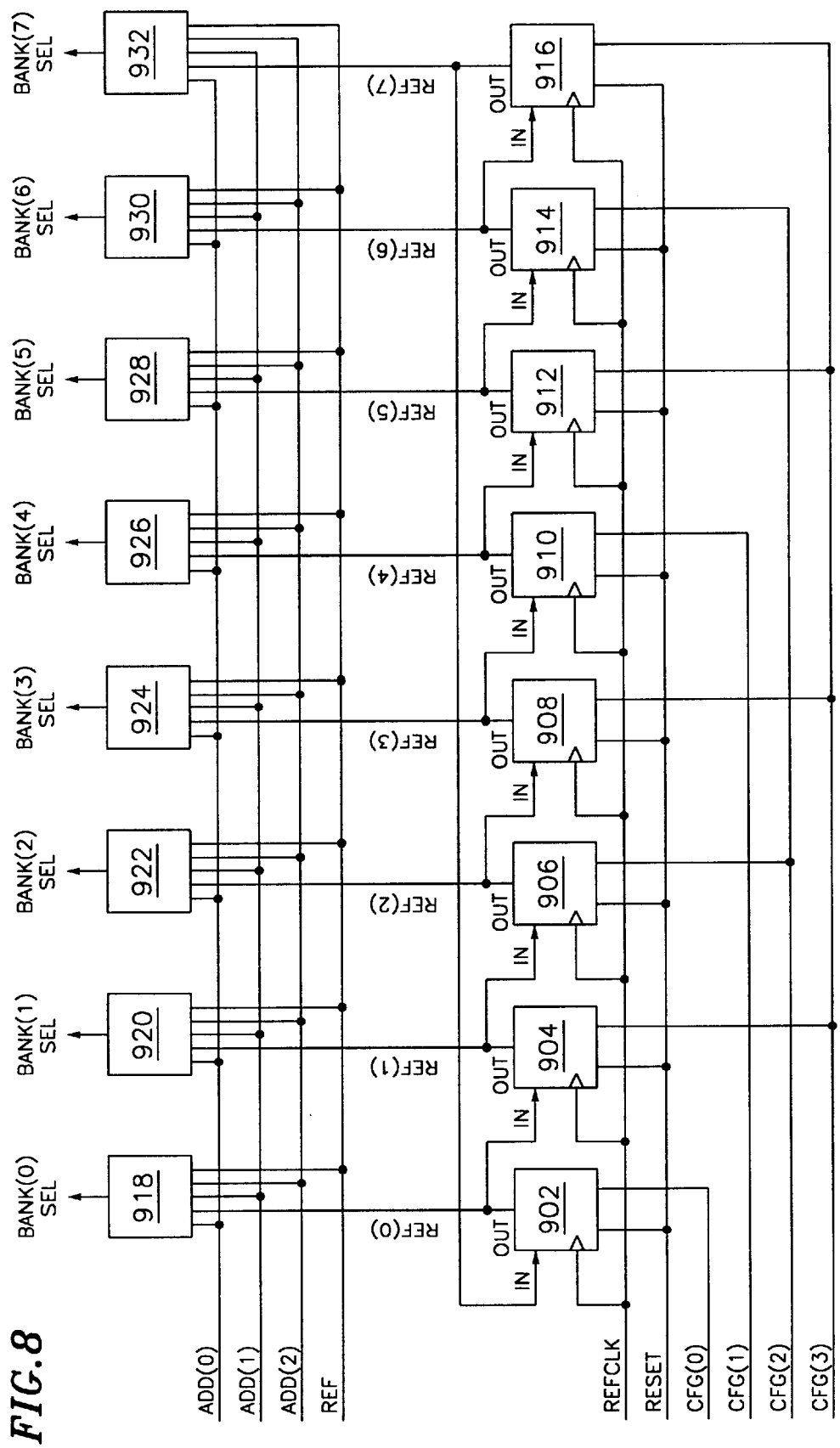
FIG. 8 is an exemplary block diagram of a register and respective decoders, according to one embodiment of the present invention.

FIG. 8 is an exemplary block diagram of the shift register 802 in FIG. 7 for an exemplary memory structure that includes eight memory banks. As shown, the outputs of the shift register (REF<0>–REF<7>) along with the LSB of the address lines (in this example, ADD<0>–ADD<2>) and the REF signal are inputs to eight decoder blocks. Based on the values of the respective output of the shift register, and the state of the REF signal (which is active in a refresh cycle), one or more banks are selected for refresh. Register 802 is programmable by a series of input lines. During the refresh cycle, the address lines are bypassed, while during the read cycle, the shift register is bypassed. In other words, the read/refresh cycle multiplexes between the address line and the shift register.

The initial configuration of the register is set by the series of input lines when a "RESET" signal is activated. After "RESET" is deactivated, the configuration lines are ignored and the shift register state is determined exclusively by applying a cyclic shift to the shift register at the conclusion of each memory access cycle. For example, if only "REF<0>" is active during "RESET", then one bank is refreshed at a time. If "CFG<0>" and "CFG<1>" are both active, then two banks are refreshed simultaneously on each cycle. If "CFG<0>", "CFG<1>", and "CFG<2>" are set, then four banks are refreshed, etc. If all "CFG<x>" lines are active, all banks are refreshed simultaneously on each cycle. The total number of configuration lines needed is equal to the log-base-2 of the number of banks or shift register cells.

The register may be loaded with data for determining the number of banks to be refreshed simultaneously at the fabrication time in a non-volatile memory 808 within the memory chip or the SOC. For example, if the fabrication determined to be a "leaky" process, there would be a need for more number of banks to be refreshed simultaneously. The register may also be loaded with data determined by a control circuitry external or internal to the memory chip.

In one embodiment, the decoders 918–932 have one or more extra inputs to allow for scalability of the memory structure. This way, if more memory banks are added to increase the storage capacity of the memory, the same decoders and layout may be used. The unused inputs of the decoders are tied to power or ground to make them inactive. For example, if the decoders are capable of taking 5 address lines as input, in the case of eight memory banks, only three address lines are used and the other two inactive address lines are tied to power or ground. If eight more banks are needed, one of the unused address lines may be used in combination with the three already-used address lines for selection of sixteen memory banks.

In one embodiment of the present invention, more than one row within a bank is refreshed at a time. Since a refresh operation only uses resources local to the memory block, a refresh scheme may be used for refreshing a programmable number of blocks simultaneously, achieving a very fast refresh interval if necessary. The row selection is accomplished with the register 806 in FIG. 7 where the number of cells in the register is equal to the total number of rows in the memory. In the hierarchical memory structures of FIGS. 5–8, through every word runs a unique Local-X (LX) word line which, when activated, simultaneously multiplexes all the bits in the corresponding word onto the local bit lines. Depending on a read or a write operation, each bit either modulates the bit line, or is written by the bit line.

Figure 9:
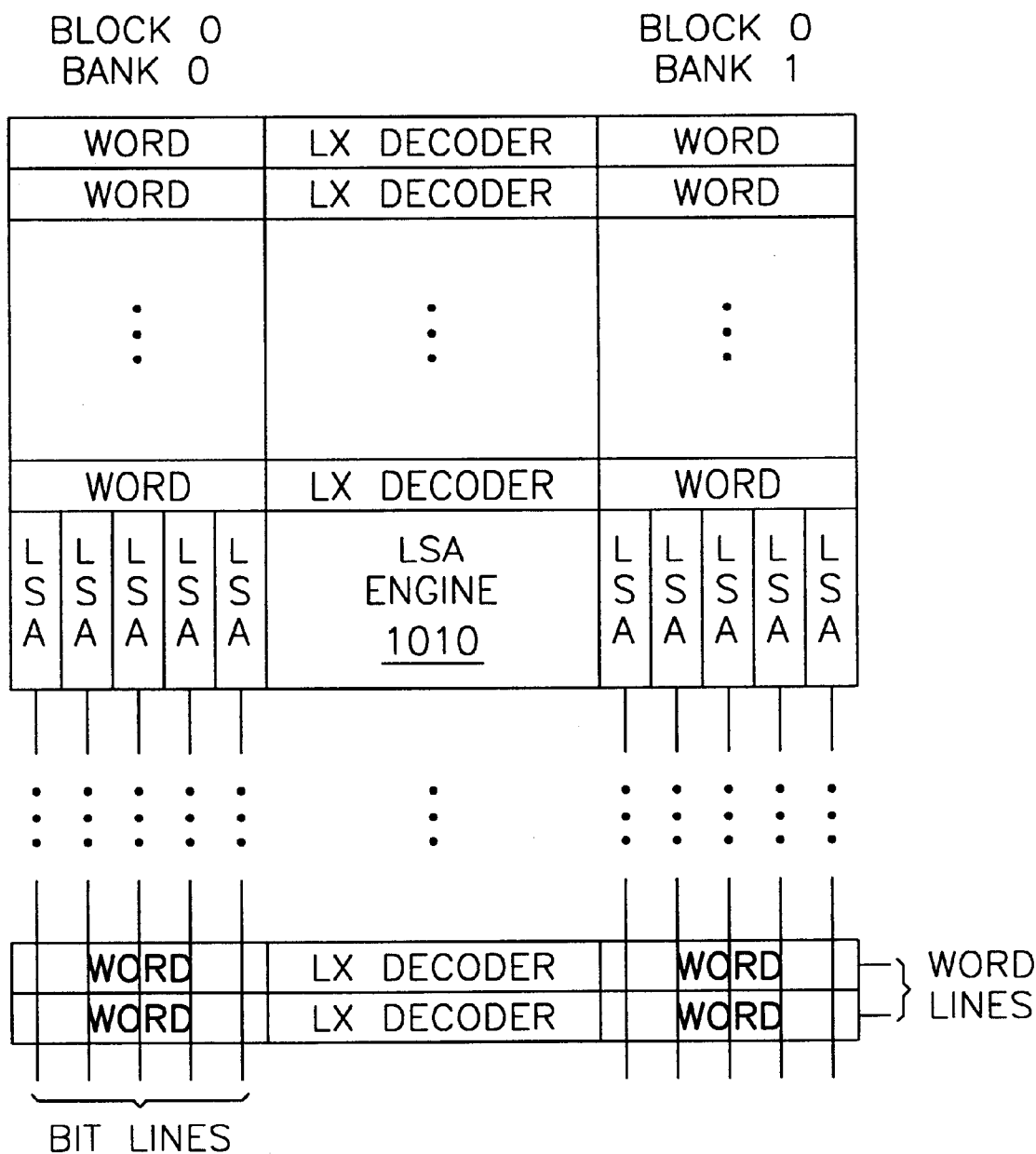
FIG. 9 is an exemplary block diagram of a hierarchical memory module including local sense amplifiers, local decoders, and a LSA engine, according to one embodiment of the present invention.

FIG. 9 is an exemplary block diagram of a hierarchical memory module including local sense amplifiers, local decoders, and a LSA engine 1010, according to one embodiment of the present invention. Each LX word line is driven by an LX-Decoder which activates the line when the corresponding memory word needs to be accessed. Under normal access conditions, a LX-Decoder activates when a local Bank-Select (BS), corresponding to a particular bank of blocks, and a Global-X (GX) word line, corresponding to an individual row in the memory, are simultaneously activated. An active cell DRAM requires separate read and write access word lines (as shown in FIG. 4A), thus in this case, each memory word is supported by a pair of LX-Decoders. Both LX-Decoders tap the same GX word line, but are activated by separate Read Bank-Select and Write Bank-Select lines. Consequently, for active cell DRAM which requires separate read and write operations, the sequencing of a write operation following a read operation during a refresh is automatically achieved. The LSA engine 1010 sequences the read and write operations by activating the read-bank and write-bank lines. When the read operation terminates, the circuitry in the LSA engine deactivates the read-bank and activates the write-bank, thereby causing the data to be refreshed back into the DRAM cell.

The array of local bit lines are supported by an array of corresponding local sense amplifiers (LSA), as shown in FIG. 9. Each LSA is capable of amplifying data on the respective local bit lines, transferring data from the respective local bit lines to the global bit lines, or transferring data from the global bit lines to the local bit lines. The global bit lines carry the data into and out of the memory block. A local Sense Engine (LSA Engine 1010) resides adjacent to the LX-Decoder array and the LSA array, as shown in FIG. 9. The LSA Engine 1010 coordinates the activities of the LX-Decoder array by activating the local BS at the appropriate time. The LSA Engine also coordinates the activities of the LSA array by providing the necessary control signals for each LSA.

As mentioned above, refreshing a cell involves reading from the cell and writing the contents back to the cell. Reading from the cell involves using a respective local SA. Therefore, more than one row within the same memory block can not be refreshed or accessed at a time. For a refresh operation, the content of a memory cell is read and then written back to the respective cell without a need to actually transmit the read data to global bit lines. As a result, only local bit lines and local SAs are used in a refresh operation. Therefore, at most one row from each of the blocks in the memory banks may be simultaneously refreshed.

Referring back to FIG. 7, the global word line decoders 620*a–d* activate the corresponding global word line depending on the contents of the refresh register 806 during the refresh cycle. During the access cycle, the decoders listen to the pre-decoded lines 62. As a result, the local word-line decoders 615*a–c* need listen only to the global word lines and the bank-select lines both during access and refresh cycles.

In an alternative embodiment (not shown), the refresh register 806 is replicated once for each bank. In this case, the global word line decoders are all inactive during the refresh cycle, and the local word-line decoders listen to the global word-line or to the refresh registers during the refresh cycle. In this embodiment, the GX word line selection is bypassed. This allows a greater degree of pipelining the refresh activity with normal memory access since much of the addressing infrastructure of the memory is unused during refresh.

If register 806 is programmed to have more than one active output (for different blocks in a memory bank), then more than one row in a bank (but in different blocks) gets refreshed simultaneously. During a refresh cycle, a REF signal becomes active and the decoders take into account the states of each respective output of the register 806 to select one or more rows within a memory bank for refreshing.

However, because only one row may be refreshed within a given block, only one output of register 806 for an entire block can be active. Depending on how many rows are included in each block, a control circuit (similar to a counter) may load the register in such a way to ensure that there is no more than one activated register output per block in a given bank. In one embodiment, instead of having a "circular" shift register, a ripple register may be used that runs vertically from bottom to top of the memory module and has a respective shift-cell for each row of the memory module. This ripple register is periodically loaded with the appropriate data to make it behave as a "virtual" circular shift register. For example, as soon as an activated register output ripples to the next memory block, the register is loaded with a new data to activate another register output for the previous memory block. For instance, if there are 64 rows in a memory block, the maximum row refresh interval would be every 64 refresh cycles, that is, a register output is activated at most every 64 cycles. However, a register output may be activated every 66, 80, 100, or 1000 refresh cycles, depending on how the intervals between the row refreshing need to be controlled.

Register 806 may also be loaded with data to set the number of rows within a bank to be refreshed simultaneously at the fabrication time in a non-volatile memory within the memory chip or the SOC. For example, if the fabrication is determined to be a "leaky" process, there would be a need for more number of rows to be refreshed simultaneously. The register may also be loaded with data determined by a control circuitry external or internal to the memory chip. Additionally, this design allows for scalability by including in each memory block added to a bank, a local pre-decoder structure that based on the input address, determines if the block is being accessed. This way, if more memory blocks are added to a bank to increase the storage capacity of the memory, the same row decoders and layout may be used. An exemplary block diagram of register 806 is shown in FIG. 8, which is similar to one implementation of register 802.

Figure 10:
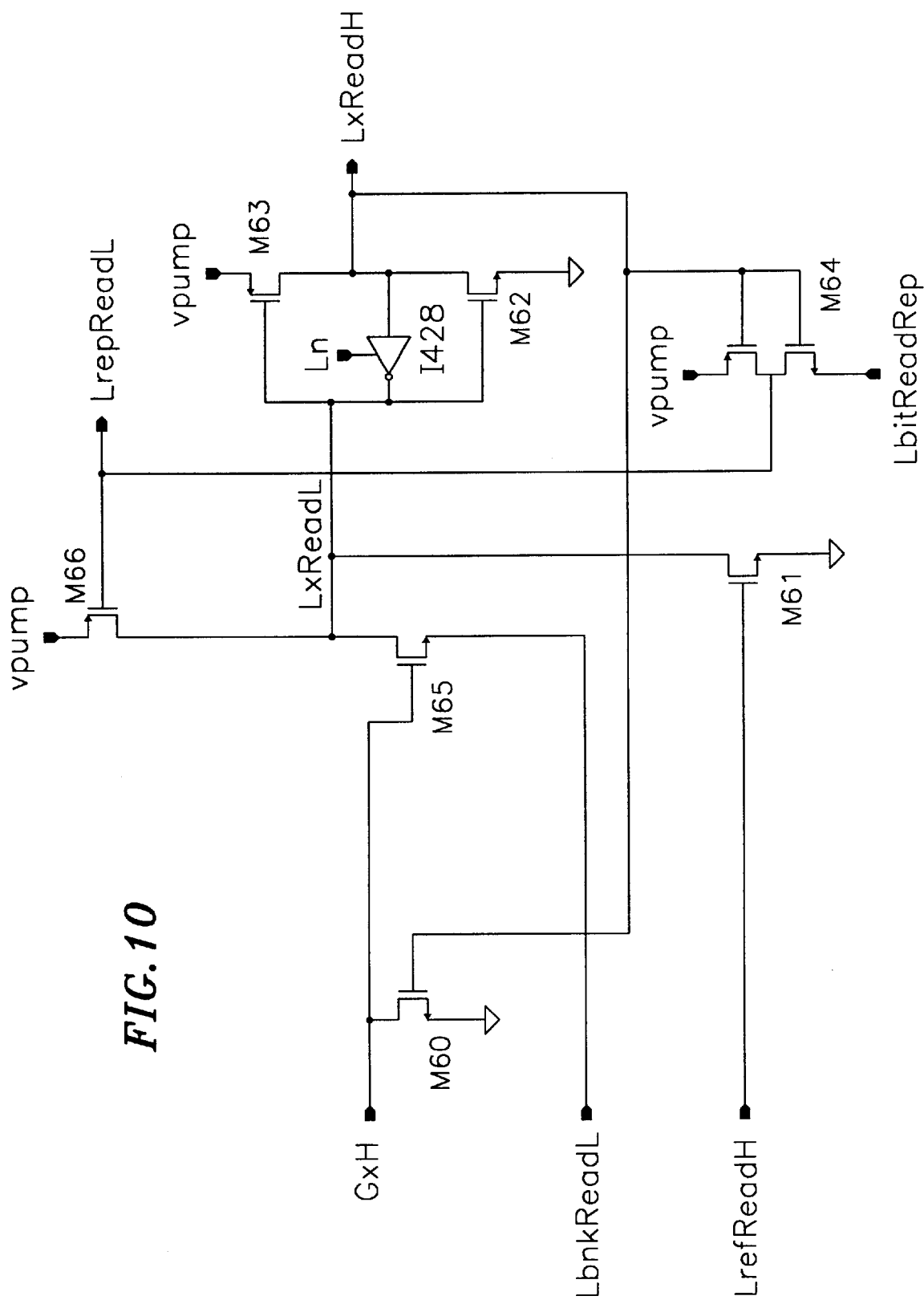
FIG. 10 is an exemplary circuit diagram of a Read Lx-Decoder, according to one embodiment of the present invention.

FIG. 10 shows an exemplary schematic for a Read LX-Decoder, as described above, each memory word is served by a Read LX-Decoder and a Write LX-Decoder. The circuits for these two decoders are similar, so only the Read LX-Decoder is described herein. Each Read (or Write) LX-Decoder includes a bistable driver/latch combination formed by transistors M62, M63 and inverter I428. "LxReadH" signal is the local word line. When the word (row) is not being accessed, the latch is in the inactive state with "LxReadH" driven low. The latch is activated through one of two paths. For normal memory access, a combination of a high signal on "GxH" and a low signal on "LbnkReadL" toggles the latch. During refresh operations, "LrefReadH" is pulsed high by a shift register circuit described below and the latch is toggled by transistor M61. In either case, when the latch toggles, "LxReadH" is driven high and a memory access is performed. "LxReadH" is fed back immediately through transistor M60 to deactivate "GxH" and prevent a further memory access on the subsequent cycle unless the GX-Decoder reactives the GX word line. Note that GX-Decoder circuit which activates "GxH" leaves "GxH" floating and relies on the LX-Decoder to reset the line. M65 causes the LX decoder to activate when GxH is high and LbnkReadL is low (active). M60 causes GxH to deactivate once LxReadH is high (active).

In one embodiment, while the LX-Decoder is activated, a replica of these actions occurs in an LX-Decoder in the LSA-Engine. The replica LX-Decoder causes a bank of memory cells to draw current from "LbitReadRep", a replica local bit line. The bank of memory cells is designed to draw a fixed multiple of the actual DRAM cell current from the replica bit line. The replica line is loaded at each LX-Decoder by transistor M64 which is designed to replicate a real memory bit load on a local bit line. A delay is therefore generated by the capacitance on this line which automatically tracks the delay necessary to develop adequate voltage development on the local bit lines. After the delay, the "LrepReadL" node is pulled sufficiently low to reset the LX-Decoder driver/latch through transistor M66. Once the driver/latch (M62, M63 and I428) is reset, "LrepReadL" is returned to its inactive high state by transistor M67. This completes the memory access cycle as far as the LX-Decoder is concerned. VPump is a voltage about 100–300 mV higher than VDD (the power supply).

Figure 11:
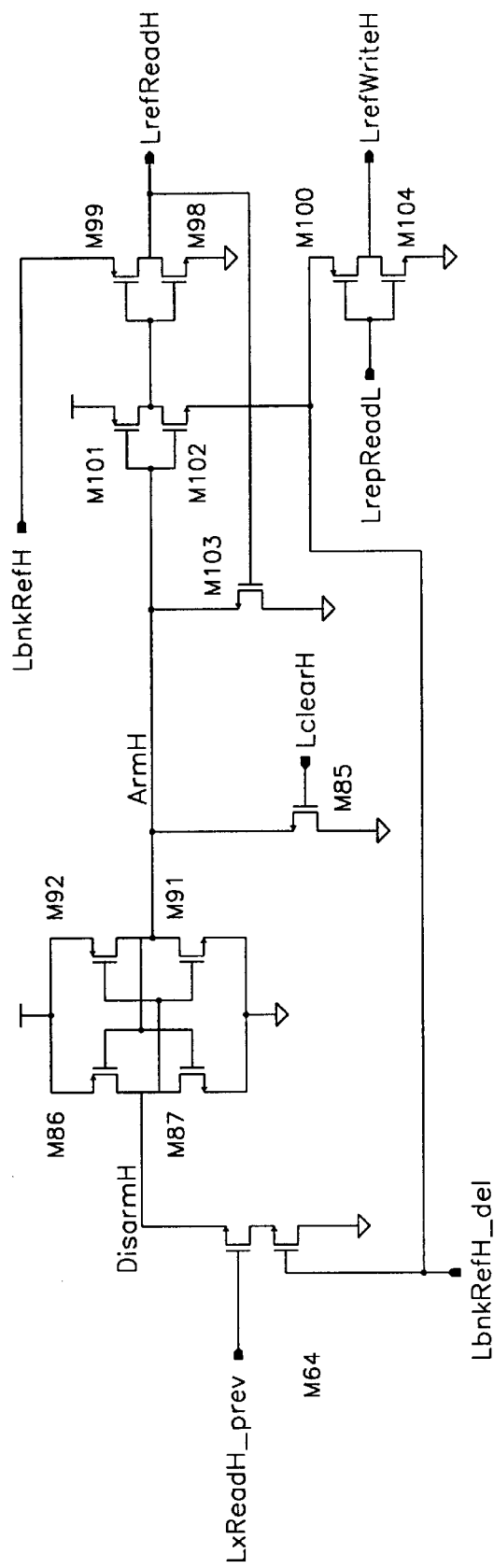
FIG. 11 is an exemplary circuit diagram of a shift register, according to one embodiment of the present invention.

FIG. 11 shows an exemplary shift register circuit with one cell per LX-Decoder. The memory element of the shift register comprises transistors M86, M87, M91, and M92 forming a back-to-back inverter pair that maintains a bistable condition. When the shift register circuit is initially powered up, transistor M85 is activated through "LclearhH" for a short time to set all shift register cells in the "disarmed" state, with nodes "armH" inactive and "disarmH" active. The LSA-Engine has a direct access to arm the first shift-cell of the shift register chain, thus driving the "armH" node active and "disarmH" inactive for that cell only. At any given time, only one shift-cell in the shift register is armed, and the remaining cells are disarmed. The memory word corresponding to the armed cell is scheduled for refresh.

The LSA-Engine initiates a refresh cycle by activating the "LbnkRefH" signal and a short time later the "LbnkRefH_del" signal. This causes the armed shift-cell to initiate a refresh of the corresponding word. If a shift-cell is armed, then the gate of inverter M98/M99 is driven low by inverter M101/M102. When "LbnkRefH" signal is activated, three actions occur. First, this line signals the Read LX-Driver circuit, described above, to activate the local Read Wordline. Second, the feedback through M103 disarms the respective shift-cell so that the memory word will not refresh during the next refresh cycle. Third, the "LbnkRefH" signal is fed to the "LxReadH_prev" signal of the next shift cell in the shift register chain. When "LbnkRefH_del" is pulled up a short time later, the next shift-cell is armed. However, since this occurs only after "LbnkRefH_del" is pulled up, the arming signal does not propagate through inverter M101/M102 and the next word is not refreshed until the following refresh cycle.

When the LX-Decoder completes the refresh reading, the data need to be written back into the memory word. The LSA-Engine signals the LSA array to amplify the data on the local bit lines and prepare the local bit lines for a write operation. As a normal course of reading data, the "LrepReadL" line in the LX-Decoder circuit is pulsed low at the conclusion of the read operation in order to reset the LX-Decoder driver/latch. This same signal is presented to the gates of transistors M100/M104 and a pulse is generated which triggers the Write LX-Decoder circuit in the same way as the Read LX-Decoder circuit was previously triggered. The source of transistor M100 is fed by "LbnkRefH_del" and ensures that the automatic write-after-read only occurs during refresh access and not during normal memory access. This design also decreases some of the external overhead of a refresh operation because in this design, as described above, a good deal of row selection control circuitry is internal to the memory.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope of the invention as defined in the claims.

What is claimed is:

1. A DRAM programmable for simultaneous refreshing of a plurality of memory words comprising:
   a plurality of memory banks each memory bank including a plurality of memory blocks and each memory block including a plurality of memory words;
   a plurality of bank decoders for selecting a respective memory bank;
   a plurality of word decoders for selecting a respective memory word in a memory block;
   a plurality of local sense amplifiers for amplifying data for a plurality of local bit lines respectively; and a programmable register for selecting a programmable plurality of memory words for simultaneous refreshing.

2. The DRAM of claim 1, wherein the programmable register is programed to simultaneously refresh a plurality of memory words in a selected plurality of memory banks.

3. The DRAM of claim 1, wherein the programmable register is programed to simultaneously refresh a plurality of memory words in a selected memory bank.

4. The DRAM of claim 1, wherein the programmable register includes a first register and a second register, the first register is programed to simultaneously refresh a plurality of memory words in a selected plurality of memory banks and the second register is programed to simultaneously refresh a plurality of memory words in each selected memory bank.

5. The DRAM of claim 2, wherein the programmable register is a shift register loadable with data for selecting a plurality of memory words in a selected plurality of memory banks for simultaneous refreshing.

6. The DRAM of claim 3, wherein the programmable register is a shift register loadable with data for selecting a plurality of memory words in a selected memory bank for simultaneous refreshing.

7. The DRAM of claim 3, wherein the programmable register is a ripple register periodically loaded with the appropriate data for selecting a plurality of memory words in a selected memory bank for simultaneous refreshing.

8. The DRAM of claim 2, wherein the programmable register includes a plurality of outputs, each output corresponding to a respective memory bank and each output is coupled with a respective bank decoder for selecting a plurality of memory words in a selected plurality of memory banks for simultaneous refreshing.

9. The DRAM of claim 3, wherein the programmable register includes a plurality of outputs, each output corresponding to a respective memory word and each output is coupled with a respective word decoder for selecting a plurality of memory words in a selected memory bank for simultaneous refreshing.

10. The DRAM of claim 1, wherein each of the plurality of bank decoders is scalable.

11. The DRAM of claim 1, wherein each of the plurality of word decoders is scalable.

12. The DRAM of claim 1, further comprising a non-volatile memory for storing programming data for the programmable register.

13. A method for simultaneously refreshing a plurality of DRAM words, the method comprising the steps of:
  arranging the DRAM with a plurality of memory banks, each memory bank including a plurality of memory blocks, wherein each memory bank is selectable by a bank decoder;
  arranging each memory block with a plurality of memory words, wherein each memory word is selectable by a word decoder; and
  programming a register for selecting a programmable plurality of memory words to be refreshed simultaneously.

14. The method of claim 13, wherein the programming step comprises the step of programming the register for simultaneously refreshing a plurality of memory words in a selected plurality of memory banks.

15. The method of claim 13, wherein the programming step comprises the step of programming the register for simultaneously refreshing a plurality of memory words in a selected memory bank.

16. The method of claim 13, wherein the programming step comprises the step of programming the register for simultaneously refreshing a plurality of memory words in a selected plurality of memory banks and simultaneously refreshing a plurality of memory words in each memory bank.

17. The method of claim 14, wherein the programming step comprises the step of loading the register with predetermined data for selecting a plurality of memory words in a selected plurality of memory banks to be simultaneously refreshed.

18. The method of claim 15, wherein the programming step comprises the step of loading the register with predetermined data for selecting a plurality of memory words in a selected memory bank to be simultaneously refreshed.

19. The method of claim 14, wherein the programming step comprises the step of coupling outputs of the register with a respective bank decoder for selecting a plurality of memory words in a selected plurality of memory banks for simultaneous refreshing.

20. The method of claim 15, wherein the programming step comprises the step of coupling outputs of the register with a respective word decoder for selecting a plurality of memory words in a selected memory bank for simultaneous refreshing.

21. The method of claim 13, further comprising the step of storing programming data for the register in a non-volatile memory for selecting a plurality of memory words to be refreshed simultaneously.

22. A DRAM comprising:
  a plurality of memory banks each memory bank including a plurality of memory blocks and each memory block including a plurality of memory words;
  means for selecting a respective memory bank; means for selecting a respective memory word in a memory block; and
  means for selecting a programmable plurality of memory words to be refreshed simultaneously.

23. The DRAM of claim 22, wherein the selecting means comprises means for programming a register for simultaneously refreshing a plurality of memory words in a selected plurality of memory banks.

24. The DRAM of claim 22, wherein the selecting means comprises means for programming a register for simultaneously refreshing a plurality of memory words in a selected memory bank.

25. The method of claim 22, wherein the selecting means comprises means for programming a register for simultaneously refreshing a plurality of memory words in a selected plurality of memory banks and simultaneously refreshing a plurality of memory words in each memory bank.

* * * * *